United States Patent
Zang et al.

(10) Patent No.: US 9,773,781 B1
(45) Date of Patent: Sep. 26, 2017

(54) RESISTOR AND CAPACITOR DISPOSED DIRECTLY UPON A SAC CAP OF A GATE STRUCTURE OF A SEMICONDUCTOR STRUCTURE

(71) Applicant: GLOBALFOUNDRIES Inc., Grand Cayman (KR)

(72) Inventors: Hui Zang, Guilderland, NY (US); Jagar Singh, Clifton Park, NY (US); Jerome Ciavatti, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/342,498

(22) Filed: Nov. 3, 2016

(51) Int. Cl.
| | |
|---|---|
| H01L 29/66 | (2006.01) |
| H01L 27/06 | (2006.01) |
| H01L 49/02 | (2006.01) |
| H01L 29/78 | (2006.01) |
| H01L 29/06 | (2006.01) |
| H01L 29/08 | (2006.01) |
| H01L 29/10 | (2006.01) |

(52) U.S. Cl.
CPC .......... *H01L 27/0629* (2013.01); *H01L 28/20* (2013.01); *H01L 28/60* (2013.01); *H01L 29/0653* (2013.01); *H01L 29/0847* (2013.01); *H01L 29/1037* (2013.01); *H01L 29/66795* (2013.01); *H01L 29/7851* (2013.01)

(58) Field of Classification Search
CPC ..... H01L 27/0629; H01L 28/60; H01L 28/20; H01L 29/66795; H01L 29/0653; H01L 29/1037; H01L 29/7851
See application file for complete search history.

(56) References Cited

U.S. PATENT DOCUMENTS

| | | | | |
|---|---|---|---|---|
| 7,060,553 | B2* | 6/2006 | Fried | H01L 21/84 257/E21.018 |
| 7,361,950 | B2* | 4/2008 | Chinthakindi | H01L 28/40 257/301 |
| 2016/0148936 | A1* | 5/2016 | Xu | H01L 27/0924 257/369 |

OTHER PUBLICATIONS

U.S. Appl. No. 15/342,464, filed Nov. 3, 2016, titled Resistor Disposed Directly Upon a SAC Cap of a Gate Structure of a Semiconductor Structure.

* cited by examiner

*Primary Examiner* — David Vu
(74) *Attorney, Agent, or Firm* — Heslin Rothenberg Farley & Mesiti P.C.; Nathan B. Davis

(57) ABSTRACT

A semiconductor structure includes a substrate. A gate structure is disposed over the substrate. The gate structure includes: a pair of gate spacers extending generally vertically from the substrate, gate metal disposed between the spacers, and a self-aligned contact (SAC) cap disposed over the gate metal to form a top of the gate structure. A first capacitor plate is disposed directly upon the SAC cap such that no additional layer is disposed between the resistor and SAC cap. An insulator layer and a second capacitor plate are disposed on the first capacitor plate forming a MIM capacitor. A pair of capacitor plate contacts are electrically connected to the first capacitor plate and the second capacitor plate.

13 Claims, 9 Drawing Sheets

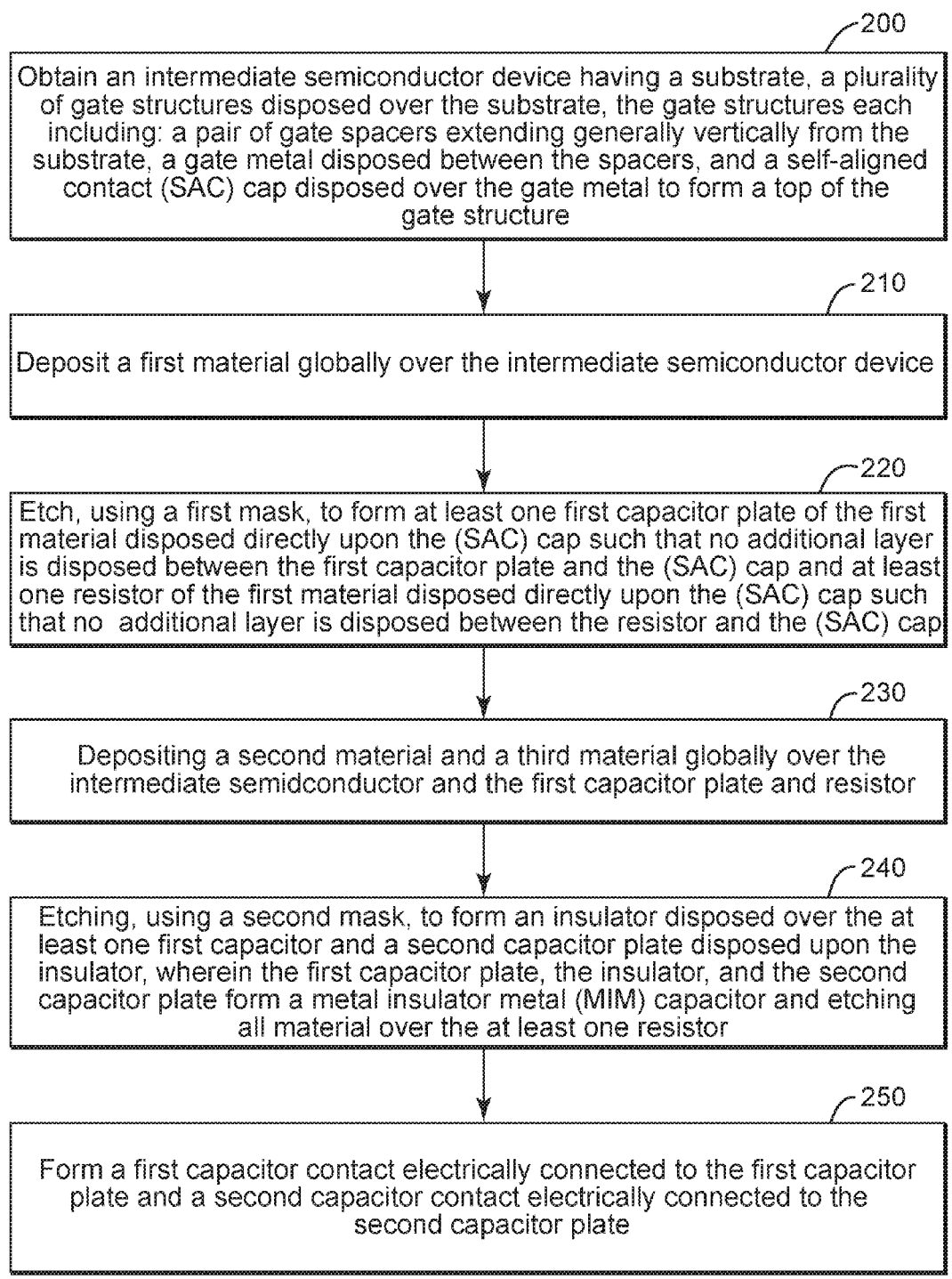

US 9,773,781 B1

RESISTOR AND CAPACITOR DISPOSED DIRECTLY UPON A SAC CAP OF A GATE STRUCTURE OF A SEMICONDUCTOR STRUCTURE

TECHNICAL FIELD

The present invention relates to semiconductor devices and methods of making the same. More specifically, the invention relates to resistors and metal insulator metal (MIM) capacitors disposed directly upon a self-aligned contact (SAC) cap of a transistor gate in a semiconductor structure.

BACKGROUND

With constant down-scaling and increasingly demanding requirements to the speed and functionality of ultra-high density integrated circuits, the integration of resistors and capacitors into prior art semiconductor structures becomes increasingly problematic. Resistors are most often integrated into a semiconductor structure during middle of the line (MOL) process flow. The MOL process flow generally includes those set of process steps used in the creation of the gate (CA) contacts and the source/drain (CB) contacts of transistors. Capacitors are typically formed in the back end of line (BEOL) process flow of a semiconductor structure. The BEOL process flow generally includes the process steps used in the formation of the several layers of metal interconnect lines used to provide the electrical connections to devices on the substrate of a semiconductor structure.

Prior art semiconductor structures require a dielectric layer disposed between the gate structure of the transistors and the resistors in order to prevent the resistors from electrically shorting to the gate. Problematically however, this increases the thickness of the dielectric layers in the MOL architecture, which exacerbates dimensional changes in width between the top and bottom of the CA and CB contacts. This is due to the fact that etching is never completely in a vertical direction. That is, any etching process (even an anisotropic RIE etch process) will always have some horizontal etch component to it. Accordingly, the top of a CA or a CB contact will always be larger than the bottom. The thicker the dielectric layers that must be etched through in order to form the CA and CB contacts, the greater the dimensional changes that will occur. These dimensional changes can have a negative effect on quality and reliability.

Also problematically in prior art semiconductor devices, the transistors and other like devices over which a resistor is disposed are rendered non-functional or disabled. This is because the resistor prevents any electrical connections from reaching the components disposed underneath them. So a Fin Field Effect Transistor (FinFET), for example, which can be made operational with CA contacts to its gate and CB contacts to its source/drain regions, is rendered non-functional if it is covered by a resistor that blocks such contacts from being made. Moreover, resistors generally have an increasingly large foot print and tend to cover larger number of devices with scaling due to the fact that their resistivity is fixed.

Capacitors also take up room in the BEOL semiconductor structure and are increasingly difficult to down-scale. Additionally, conventional process flow requires at least a single mask to form resistors in the MOL and at least two separate masks to form capacitors in the FEOL of a semiconductor structure. The use of such multiple masks adds cost and complexity to the manufacturing process of a semiconductor structure.

Accordingly, there is a need for a semiconductor structure that does not require a dielectric layer between resistors and gates in order to prevent electrical shorting. Additionally there is a need for a semiconductor structure wherein the resistors do not disable the components disposed below them, and can be used to form further devices over the transistor. Additionally, there is a need for a method to reduce the number of masks used to form resistors and capacitors in a semiconductor structure.

BRIEF DESCRIPTION

The present invention offers advantages and alternatives over the prior art by providing various embodiments of a semiconductor structure having a resistor and a MIM capacitor disposed directly over a SAC cap of a transistor gate. The invention improves the MOL process quality and reduces fabrication costs by eliminating or reducing the thickness of at least one dielectric layer required relative to a conventional fabrication process of a resistor in a semiconductor structure and reducing the number of masks needed to form the MIM capacitor and resistor over the SAC cap. Additionally, in some embodiments, transistors disposed under a resistor and a MIM capacitor formed in accordance with the present invention are functionally enabled as compared to prior art resistors which necessarily disable any transistors disposed thereunder.

A semiconductor structure in accordance with one or more aspects of the present invention includes a substrate. A gate structure is disposed over the substrate. The gate structure includes: a pair of gate spacers extending generally vertically from the substrate; gate metal disposed between the spacers; a self-aligned contact (SAC) cap disposed over the gate metal to form a top of the gate structure; a first capacitor plate disposed directly upon the SAC cap such that no additional layer is disposed between the first capacitor plate and SAC cap; an insulator layer disposed upon the first capacitor plate; a second capacitor plate disposed upon the insulator, wherein the first capacitor plate, the insulator, and the second capacitor plate form a metal insulator metal (MIM) capacitor; and a first capacitor contact electrically connected to the first capacitor plate and a second capacitor contact electrically connected to the second capacitor plate.

In another embodiment of the present invention a method includes: obtaining an intermediate semiconductor device having a substrate, a plurality of gate structures disposed over the substrate, the gate structures each including: a pair of gate spacers extending generally vertically from the substrate, a gate metal disposed between the spacers, and a self-aligned contact (SAC) cap disposed over the gate metal to form a top of the gate structure; depositing a first material globally over the intermediate semiconductor device; etching, using a first mask, to form at least one first capacitor plate of the first material disposed directly upon the SAC cap such that no additional layer is disposed between the first capacitor plate and the SAC cap and at least one resistor of the first material disposed directly upon the SAC cap such that no additional layer is disposed between the resistor and the SAC cap; depositing a second material and a third material globally over the intermediate semiconductor and the first capacitor plate and resistor; etching, using a second mask, to form an insulator disposed over the at least one first capacitor and a second capacitor plate disposed upon the insulator, wherein the first capacitor plate, the insulator, and the second capacitor plate form a metal insulator metal (MIM) capacitor and etching all material over the at least one resistor; and forming a first capacitor contact electrically connected to the first capacitor plate and a second capacitor contact electrically connected to the second capacitor plate.

DRAWINGS

The invention will be more fully understood from the following detailed description taken in conjunction with the accompanying drawings, in which.

Figure 9:
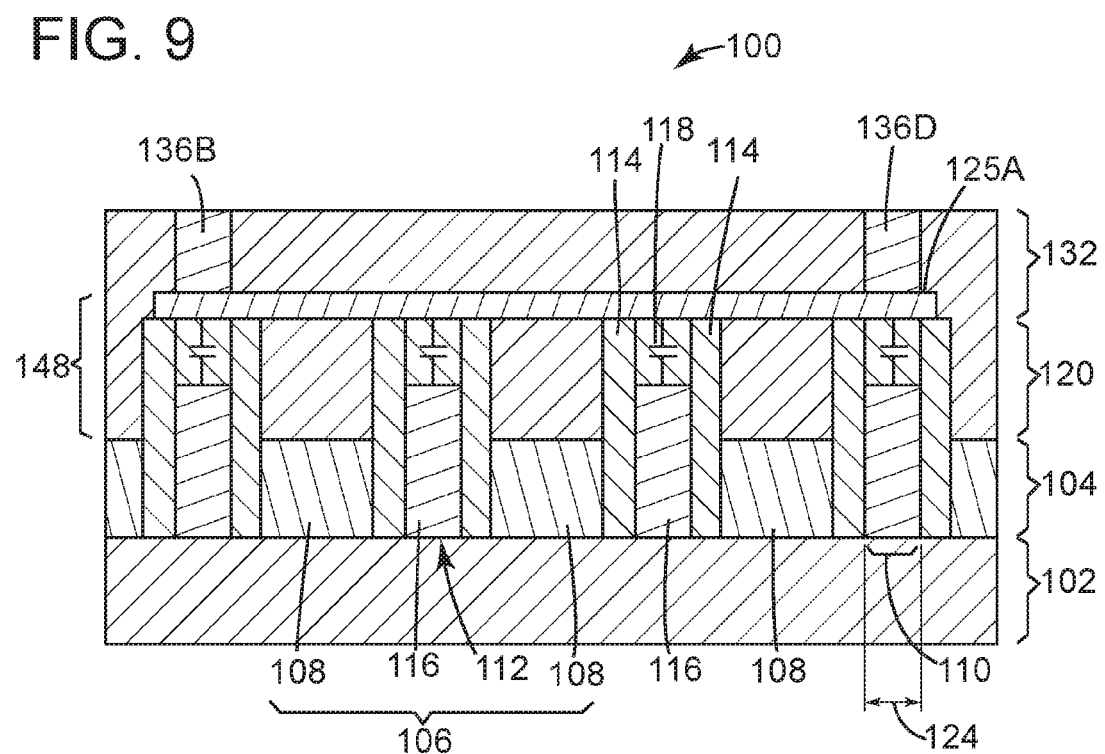

FIG. 9 is an exemplary embodiment of a cross sectional view of a semiconductor structure having gate structures with short channels and a first capacitor plate disposed directly over the SAC caps of the gate structures forming a MIM capacitor of the resistor, the SAC caps, and the gate metal in accordance with the present invention; and FIG. 10 is a flow chart of a method of making an intermediate semiconductor device in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1:
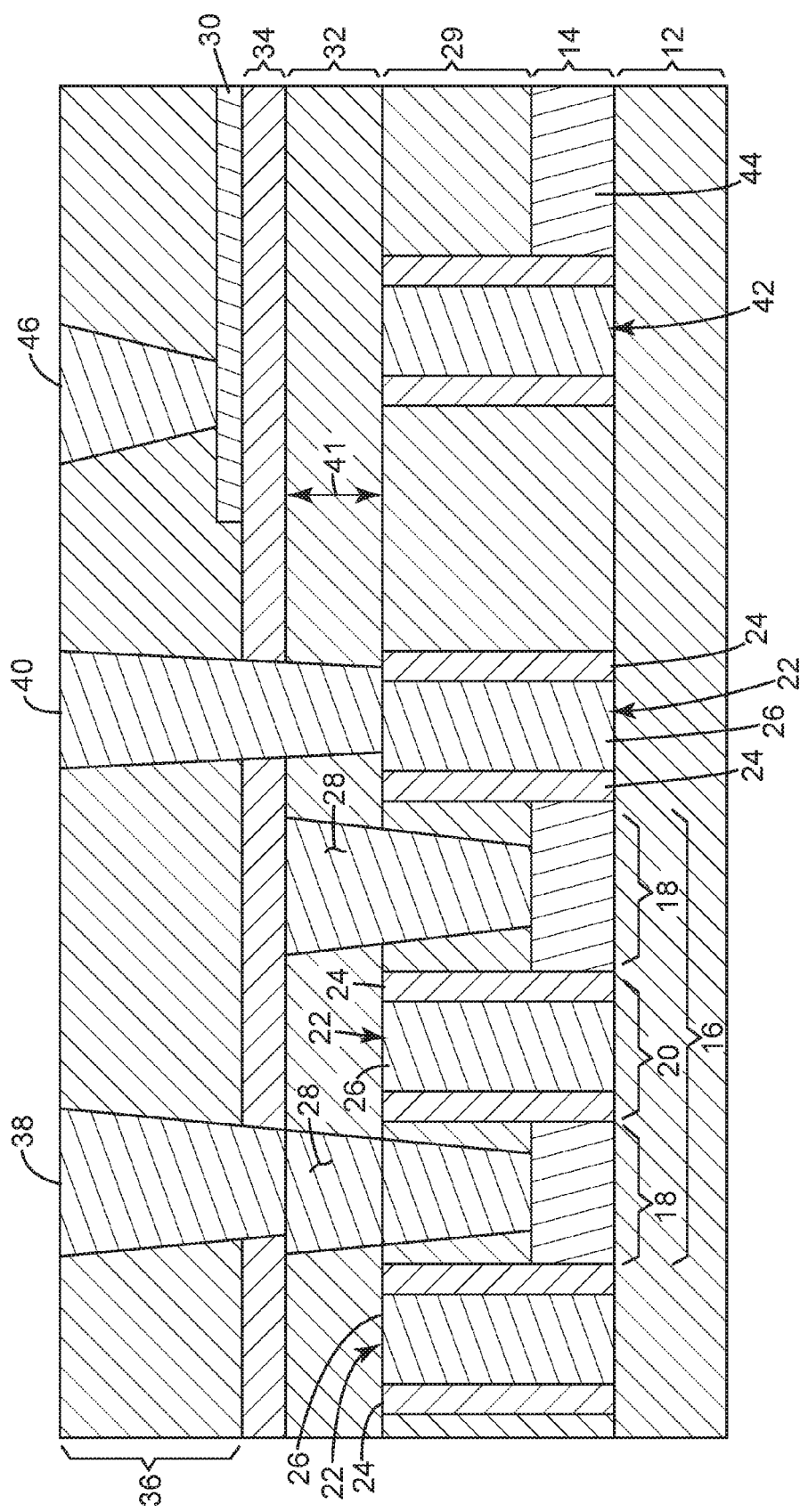
FIG. 1 is an exemplary embodiment of a prior art semiconductor structure.

FIG. 1 represents an exemplary embodiment of a prior art semiconductor structure with a resistor disposed in its MOL architecture. The resistor is separated from the gate structures below it by a dielectric layer in order to prevent an electrical shortage between gates and resistor.

FIGS. 2-10 illustrate various exemplary embodiments of a semiconductor structure in accordance with the present invention. The gate structures of the semiconductor structure have a self-aligned contact (SAC) cap disposed over the top of the gate metal within the gate structures. A MIM capacitor is disposed directly upon the SAC caps in accordance with the present invention. No additional dielectric layer is required to separate the MIM capacitor from the gate structures in order to prevent an electrical shortage between gates and MIM capacitor.

Referring to FIG. 1, an exemplary embodiment of a prior art semiconductor structure 10 is presented. Semiconductor structure 10 is in the 40 nm technology node. Semiconductor structure 10 includes a substrate 12 having a fin 14, which extends vertically upward from the substrate 12 and horizontally across the substrate 12. The fin 14 is one of a plurality of fins that extend longitudinally and substantially parallel across the substrate to define an active (Rx) region of the substrate 12.

Bordering the Rx region is an isolation region, such as a shallow trench isolation (STI) region, a deep trench isolation region or the like, that is used to separate the Rx region from various other active regions on semiconductor structure 10. The isolation region is typically composed of an amorphous dielectric material, such as a flowable oxide (FOX) or the like.

A plurality of Fin Field Effect Transistors (FinFETs) 16 are disposed within each of the fins 14. The FinFETs 16 each include a pair of source/drain (S/D) regions 18 disposed within the fin 14, which define a channel region 20 disposed therebetween and also within the fin 14.

A plurality of gate structures 22 are disposed over and around the portions of the fins 14 which are the channel regions 20 of transistor 16. The gate structures 22 extend substantially perpendicular to the fins 14 across the Rx region and may even extend into the isolation regions. The gate structures include: a pair of gate spacers 24 extending generally vertically from the substrate 12, and gate metal 26 disposed between the spacers 24.

The gate spacers 24 are composed of a dielectric material such as SiN, SiNC, SiBCN or similar. The gate metal 26 is typically a stack of gate metals, which generally includes three main groups of structures (not shown). Those three main structures are: the gate dielectric layers (typically a high-k dielectric material), the work-function metal structures (typically TiN, TaN, TiCAl, other metal-nitrides or similar materials) and the gate electrode metal (typically Al, W, Cu or similar metal). The gate dielectric layers are used to electrically insulate the work-function metal structures and the gate electrodes from the substrate. The work-function metal structures are generally metal-nitrides that provide the work-function needed for proper FinFET operation, but typically have 10 to 100 times larger resistivity than the gate electrodes. The gate electrodes are metals, such as tungsten, with a very low resistivity.

Disposed over the S/D regions 18 and between the gate structures 22 is an inter-layer dielectric (ILD) layer 29, which is typically composed of an oxide such as SiO2. The ILD layer 29 extends upwards from the fins 14 to a level (i.e., vertical height above the substrate 12) that is substantially equal to the vertical height of the tops of the gate structures 24 relative to the substrate 12.

During process flow, the ILD layer 29 is planarized down to expose the tops of the gate structures 22. It is important to note that in this size technology node (e.g., 40 nm and greater), the tops of the gate structures 22 include the exposed gate metal 26.

Because the tops of the gate structures 22 in this prior art semiconductor structure 10 include exposed gate metal 26, any resistor or capacitor, such as resistor 30, cannot be disposed at the same level as the gate structures 22 without undesirably shorting to the gate metal 26. As such, it is necessary to dispose a second dielectric layer 32, which is dedicated to separating and electrically isolating the resistor 30 from the tops of the gate structures 22. Over the dielectric layer 32 is deposited an etch stop layer 34, such as SiN or the like, that is required for the formation of resistor 30. Resistor 30 is then disposed over the etch stop layer 34 through well-known processes.

Trench Silicide (TS) layers 28 are disposed on opposing sides of the gate structures 22 and over the S/D regions 18. The TS layers extend vertically upward above the tops of the gate structure 22 to the level of the second dielectric layer 32. It is important to note that the tops of TS layers 28 must extend above the tops of the gate structure 22 for proper contact with the CA contacts. In that respect, the second dielectric layer serves a dual purpose of providing a second level for the top of the TS layers 28 and of providing electrical isolation between the resistor 30 and the gate metal 26. It is also important to note that if the requirement for electrical isolation between resistor 30 (or a capacitor) and gate metal 26 were removed, then the second dielectric layer 32 could be made thinner (for example as much as 20 nm thinner or more in this embodiment).

The TS layers 28 may be disposed by a process of TS metallization. The TS metallization process may include formation of a bottom slicide layer over the S/D regions 18 followed by deposition of a top conducting metal layer. The bottom silicide layer may be composed of Ni, Ti, NiPt silicide or the like. The conducting metal layer may be composed of TiN, TaN and bulk conducting materials such as W, Co or Ru. The TS layers 28 extend substantially parallel to the gate structures 22 across the entire Rx region in order to ensure proper electrical contact with the S/D regions 18 of FinFETs 16 even under worst case misalignment conditions.

Disposed over the semiconductor structure 10, including over the second dielectric layer 32, etch stop layer 34, and resistor 30 is an oxide fill layer (or third dielectric layer) 36. During process flow, the oxide fill layer 36 is used for patterning, etching and forming the source/drain (CA) contacts 38 and the gate (CB) contacts 40. The CA contacts 38 are etched down to land on the TS layers 28 to make electrical contact to the S/D regions 18 of transistors 16. The CB contacts 40 are etched down to make electrical contact with the gate metal 26 of gate structures 22.

Note that in this prior art semiconductor structure 10, the thickness 41 of the second dielectric layer 32 has added extra depth that must be etched through in order to land on target. This makes it more difficult to form proper electrical continuity from the CA contacts 38, through the TS layers 28, and to the S/D regions 18. Additionally it makes it more difficult to form proper electrical continuity between the CB contacts 40 and the gate metal 26. Further, this added depth increases the dimensional changes from top to bottom of the CA contacts, CB contacts and TS layers 28. Accordingly, if the thickness 41 can be reduced, then quality and reliability can be improved.

Also problematically, any devices located below the resistor 30 are rendered inoperative. For example, in this embodiment, gate structure 42 and S/D region 44 are located directly below resistor 30. However, the resistor 30 prevents any contacts, such as contact 46, from reaching either gate structure 42 or S/D region 44 in order to electrically enable them. Therefore both gate structure 42 and S/D region 44 are inoperative.

Figure 2:
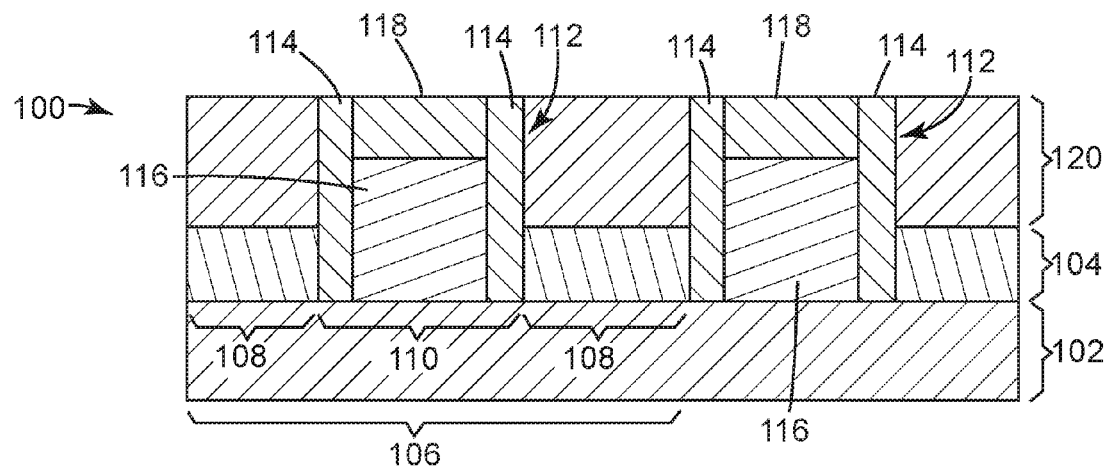
FIG. 2 is an exemplary embodiment of a simplified cross sectional view of a semiconductor structure at an intermediate stage of manufacture in accordance with the present invention.

Referring to FIG. 2, an exemplary embodiment of a simplified side view of a semiconductor structure 100 in accordance with the present invention is presented at an intermediate stage of manufacturing. Semiconductor structure is in the 10 nm technology node. At this stage of the process flow, semiconductor structure 100 includes a substrate 102 having a fin 104, which extends vertically upward from the substrate 102 and horizontally across the substrate 102. The fin 104 is one of a plurality of fins that extend longitudinally and substantially parallel across the substrate to define an active (Rx) region 138 (best seen in FIG. 7A) of the substrate 102.

Bordering the Rx region is an isolation region 140 (best seen in FIG. 7A), such as a shallow trench isolation (STI) region, a deep trench isolation region or the like, that is used to separate the Rx region from various other active regions on semiconductor structure 100. The isolation region is typically composed of an amorphous dielectric material, such as a flowable oxide (FOX) or the like.

A plurality of Fin Field Effect Transistors (FinFETs) 106 are disposed within each of the fins 104. The FinFETs 106 each include a pair of source/drain (S/D) regions 108 disposed within the fin 104, which define a channel region 110 disposed therebetween and also within the fin 104.

A plurality of gate structures 112 are disposed over the substrate 102 and around the portions of the fins 104 which are the channel regions 110 of transistor 106. The gate structures 112 extend substantially perpendicular to the fins 104 across the Rx region 138 and may even extend into the isolation regions 140. The gate structures include: a pair of gate spacers 114 extending generally vertically from the substrate 102, gate metal 116 disposed between the spacers 114, and a self-aligned contact (SAC) cap 118 disposed over the gate metal 116 to form a top of the gate structure 112.

The gate spacers 114 are composed of a dielectric material such as SiN, SiNC, SiBCN or similar. The gate metal 26 is typically a stack of gate metals, which generally includes the gate dielectric layers (typically a high-k dielectric material), the work-function metal structures (typically TiN, TaN, TiCAl, other metal-nitrides or similar materials) and the gate electrode metal (typically Al, W, Cu or similar metal). The SAC caps 118 are also a dielectric material that is similar, if not identical, to the material of the gate spacers 114.

In contrast to the semiconductor structure 10 of FIG. 1, which is a significantly larger technology node (in this embodiment, the 40 nm technology node), the smaller semiconductor structure 10 of FIG. 2 (within the 10 nm technology node in this embodiment) requires SAC caps 118 over the gate metal 116. This is because, with scaling to ultra-small dimensions, the TS layers 130 (best seen in FIG. 5) and gate structure 112 come very close to each other or may even touch. Therefore, without the SAC caps 118, the TS layers 130 have an unacceptably high probability of shorting to the gate metal 116. A typical size range where such SAC caps 118 are utilized would be in semiconductor structures that have a fin to fin pitch of 45 nm or less, or even 35 nm or less. Another typical size range in which SAC caps are used is where the distance from gate center to gate center is 68 nm or less.

The SAC caps 118 are typically formed by first recessing the gate metal 116 below the level of the top of the gate structure 112. However, the gate spacers 114 are not typically recessed. Thereafter, a layer of SAC cap material, such as SiN or SiNC, is disposed over the semiconductor structure 100 and within the recessed top of the gate structure 112. Next the SAC cap layer is planarized down to self-align the SAC caps 118 to the edges of the gate spacers 114.

The SAC caps 118 and the gate spacers 114 now completely enclose and electrically isolate the gate metal 116 from the TS layers 130. Advantageously, the SAC caps 118 also provide added real estate within the semiconductor structure 100 for various novel embodiments of a MIM capacitor 148 (best seen in FIG. 4) without the need for a second dielectric layer (such as prior are dielectric layer 32 of FIG. 1) to provide electrical isolation between the MIM capacitor 148 and the gate metal 116. Although a resistor 30 is used in the prior art, the SAC caps 118 allow for inclusion of a resistor directly on the device, or in these embodiments, for forming a MIM capacitor 148 directly on the SAC caps 118, which was not possible in the prior art.

Disposed over the S/D regions 108 and between the gate structures 112 is an inter-layer dielectric (ILD) layer 120, which is typically composed of an oxide such as SiO2. The ILD layer 120 extends upwards from the fins 104 to a level (i.e., vertical height above the substrate 102) that is substantially equal to the vertical height of the tops of the gate structures 112.

Figure 3:
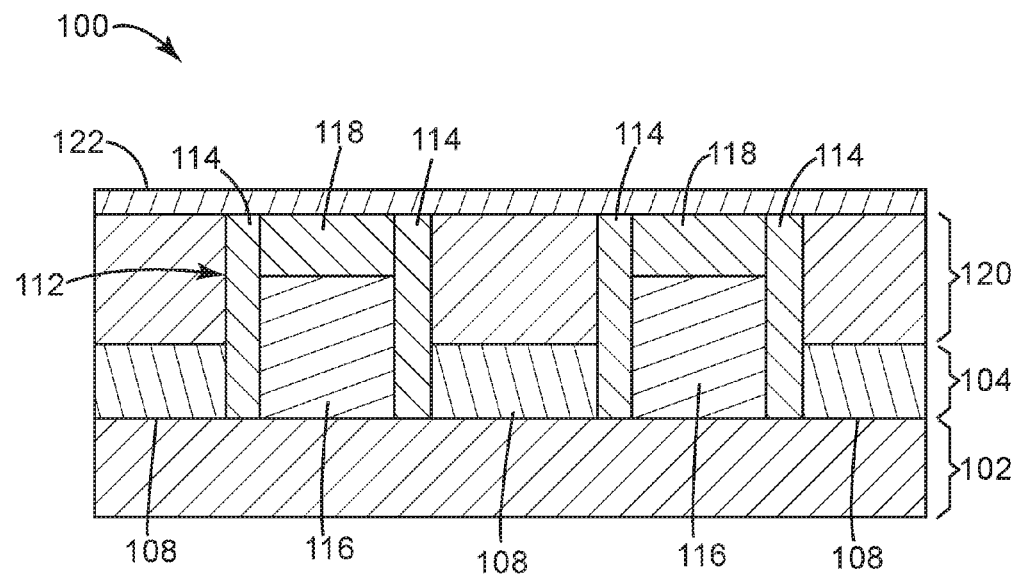
FIG. 3 is an exemplary embodiment of a cross sectional view of the semiconductor structure of FIG. 2 having a first capacitor plate layer disposed directly upon SAC caps of gate structures in accordance with the present invention.

Referring to FIG. 3, next in the process flow a first material layer 122 is disposed over the semiconductor structure 100. The first material layer 122, which can include any resistor, metal, or capacitor material, is disposed directly over the SAC caps such that no additional layer (such as prior art dielectric layer 32 of FIG. 1) is disposed between the first material layer 122 and the SAC cap.

The first material layer 122 may be composed of any material suitable for providing a capacitance across a MIM capacitor. In some embodiments, the first material layer 122 can also include a resistor material, including any material suitable to provide a predetermined resistance to a current that will be conducted through the resistor material after formation. Such material may be a silicide such as a tungsten silicide, a metal such as aluminum or other suitable material. Advantageously, this layer can be used to form both a capacitor plate and a resistor, in further steps as will be described below.

Figure 4:
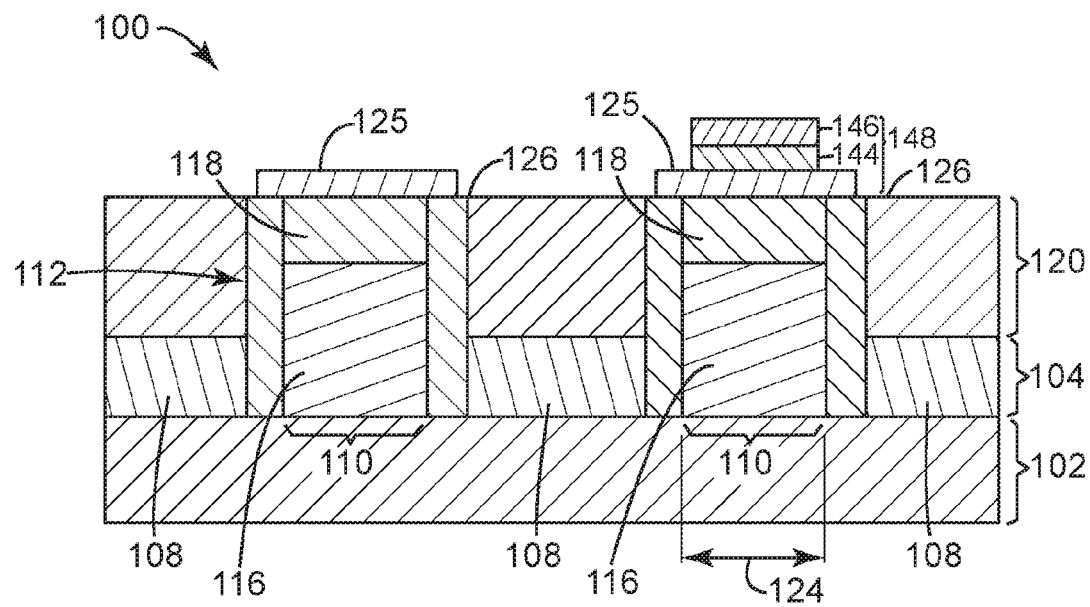
FIG. 4 is an exemplary embodiment of a cross sectional view of the semiconductor structure of FIG. 3 having first capacitor plates disposed directly over the SAC caps of long channel gate structures and an insulator layer and second capacitor plate, forming a MIM capacitor on at least one SAC cap in accordance with the present invention.

Referring to FIG. 4, an exemplary embodiment of a long channel gate structure 112 is presented. For purposes herein, the channel height 124 of the channels 110 (i.e., the horizontal distance across the gate metal 116) can be classified as either long or short. A short channel 110 herein is one where its channel height 124 is 30 nm or less. A long channel 110 herein is one where its channel height 124 is 80 nm or greater.

In the long channel embodiment of FIG. 4, the gate structure 112 is large enough to lithographically pattern and etch, using a first mask, the first material layer 122 to form first capacitor plates 125 that are fully within a perimeter of the top of the gate structure 112. That is, the top of the gate structure 112 has a perimeter 126 which defines the top boarders of the gate structure 112. In a long channel gate structure 112, that perimeter 126 is large enough to be within the capabilities of conventional lithography to pattern the first material layer 122 such that the formed first capacitor plates (and thus the resulting MIM capacitors) 125 are disposed entirely within that perimeter 126. Note that the first material layer 122 and gate metal 116 are electrically isolated from each other by the SAC cap 118.

Using a second mask, an insulating layer 144 and second capacitor plate 146 can be patterned over one or more of the first capacitor plates 125, forming a metal insulator metal (MIM) capacitor of the first capacitor plate 125, the insulating layer 144, and the second capacitor plate 146. For instance, using a first mask, a globally deposited first material layer 122 is etched to form the first capacitor plates 125. Then, both an insulating layer and a second material layer can be deposited globally, and a second mask used to pattern from these stacks the insulator layer 144 and second capacitor plate 146. In prior attempts, at least three masks would be required to form a MIM capacitor 148. However, as the insulating layer 144 and the second capacitor plate 146 are directly over the first capacitor plate 125, which is directly over the SAC caps 118, the same second mask can be used to pattern both the insulating layer 144 and the second capacitor plate 146 in the same size and shape. As seen on the left side of FIG. 4, at least one first capacitor plate 125 can be formed without adding the insulator layer 144 or the second capacitor plate 146 over it. In these embodiments, first capacitor plate 125 can be utilized as a resistor for these portions of device 100.

Figure 6:
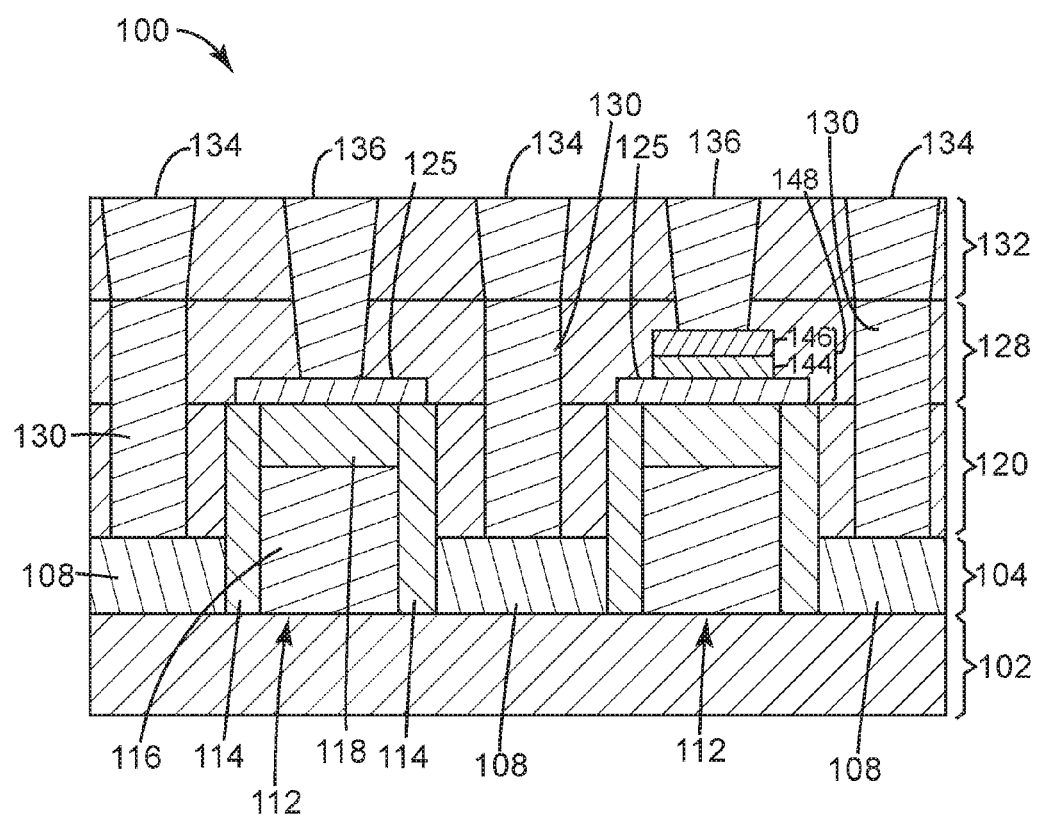
FIG. 6 is an exemplary embodiment of a cross sectional view of the semiconductor structure of FIG. 5 having gate (CB) contacts and source/drain (CA) contacts disposed therein in accordance with the present invention.

In some embodiments, the first capacitor plate 125 has a lower resistance than the second capacitor plate 146 or the combination of the second capacitor plate 146 and the insulating layer 144. For instance, the first capacitor plate 125 can include tungsten silicide (WSi), titanium nitride (TiN), or tantalum nitride (TaN), or a combination thereof. The second capacitor plate may include tungsten silicide (WSi), or even higher resistance materials. This can allow for two different levels of resistivity in the same device, increasing the number of configurations available. The resistivity can be higher on top as there can be more than one contact (136; FIG. 6) on the second capacitor plate 146, allowing for shorter paths, lowering the effective resistivity. If a contact is place under the MIM capacitor 148, the resistance can be vertical rather than horizontal, even further lowering the effective resistivity.

Still referring to FIG. 4, the MIM capacitor 148 allows for a vertical capacitance. Contrary to previous attempts, which would not allow for the combination of a resistor and a MIM capacitor, by allowing for lowering the resistivity of first capacitor plate 125 and increasing the resistivity of second capacitor plate 146, a capacitor can be formed whilst maintaining an effective resistor where no second capacitor plate is included, or even the first capacitor plate 125 below can still act as a resistor within the MIM capacitor 148.

Figure 5:
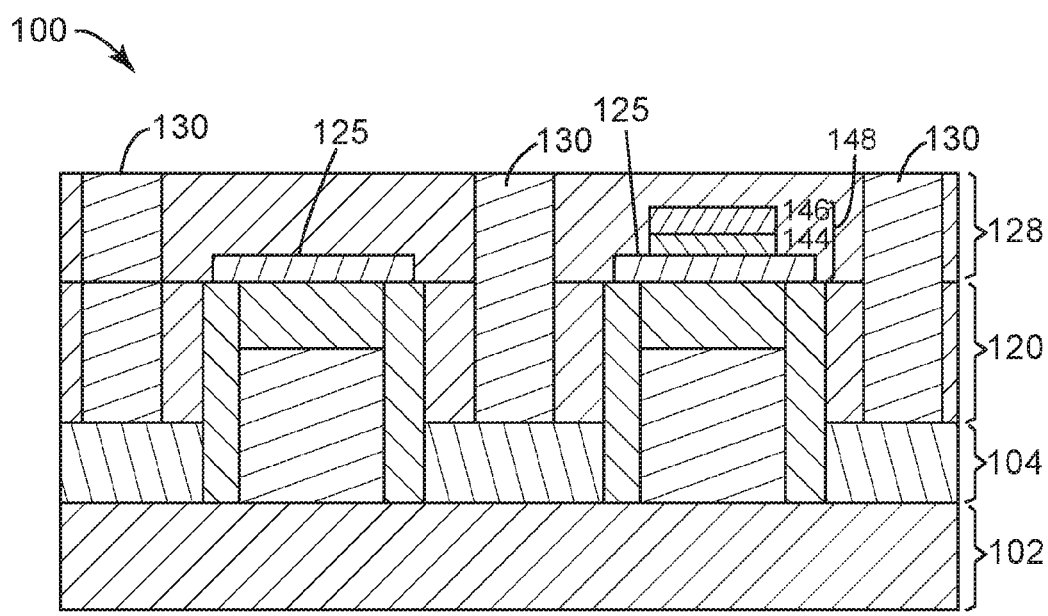
FIG. 5 is an exemplary embodiment of a cross sectional view of the semiconductor structure of FIG. 4 having trench silicide (TS) layers disposed thereon in accordance with the present invention.

Referring to FIG. 5, a second dielectric layer 128 is disposed over the structure 100. The second dielectric layer provides a second level, higher than the tops of the gate structures 112. The TS layers 130 are then formed, wherein they extend from the S/D regions 108 to the top of the second dielectric layer 128. It is important to note that the second dielectric layer 128 does not have to provide functional electrical isolation between the MIM capacitor 148 and the gate metal 116. That function is provided by the SAC cap 118. As such, the second dielectric layer 128 can be made thinner than prior art dielectric layers (such as dielectric layer 32 of FIG. 1). For example, in this embodiment, dielectric layer 128 can be as much as 20 nm thinner than prior art dielectric layer 32. Accordingly, the TS layers 130 of FIG. 5 can be formed with less variations in width between their tops and bottoms relative to prior art TS layers 28 of FIG. 1.

Referring to FIG. 6, next an oxide fill layer 132 is disposed over the semiconductor structure 100, including the second dielectric layer 128 and TS layers 130. During process flow, the oxide fill layer 132 is used for patterning, etching and forming the source/drain (CA) contacts 134 and the gate (CB) contacts 136. The CA contacts 134 are etched down to land on the TS layers 130 to make electrical contact to the S/D regions 108. The CB contacts 136 are etched down to make electrical contact with the first capacitor plate 125 on one side and the second capacitor plate 146 on another side.

Figure 7B:
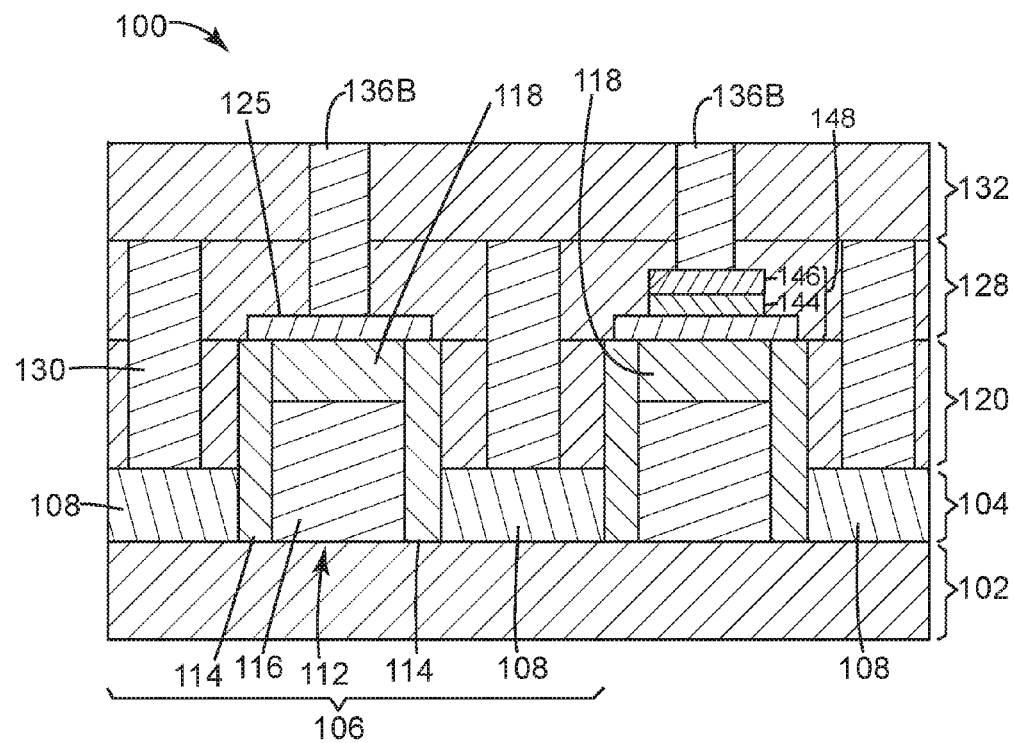
FIG. 7B is a cross sectional view of FIG. 7A taken along the line 7B-7B in accordance with the present invention.
Figure 7A:
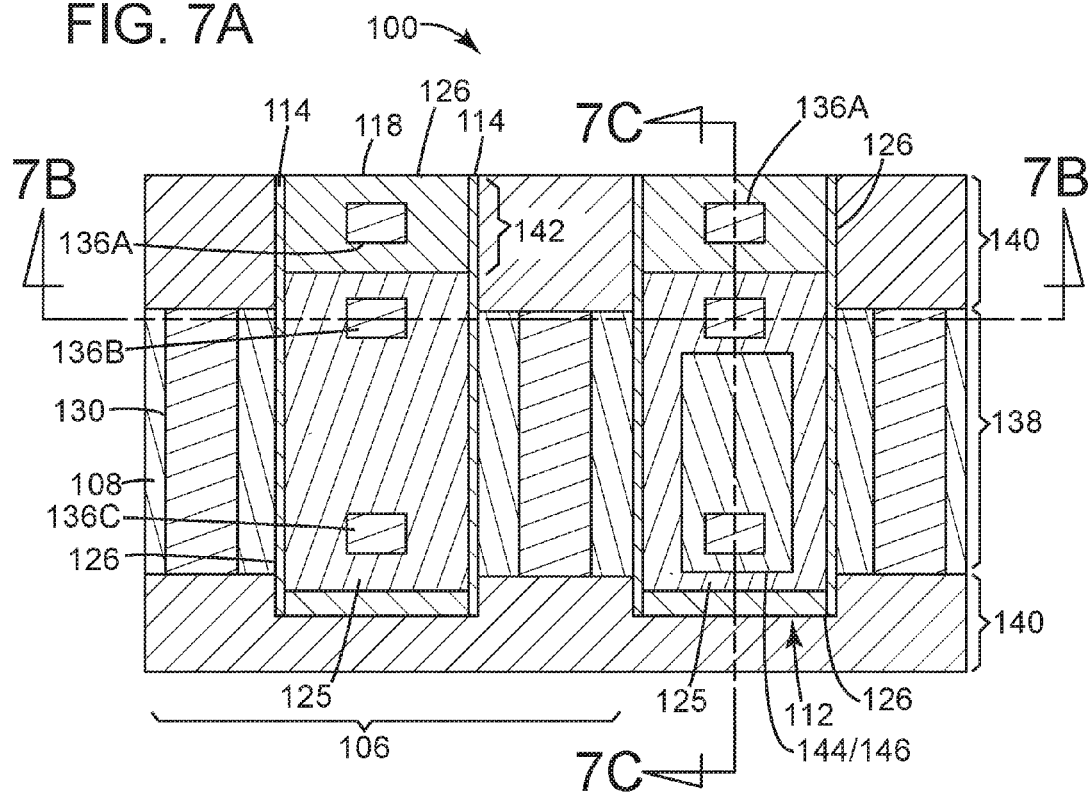
FIG. 7A is an exemplary embodiment of a top view of the semiconductor structure of FIG. 6 without the CA contacts in accordance with the present invention.

Referring to FIG. 7A, a top view of the semiconductor structure 100 of FIG. 6 is presented without the CA contacts 134 being shown. Because the gate structure 112 has a long channel 116, the perimeter 126 of the top of the gate structure 112 is large enough to lithographically pattern the resistors 125 and the MIM capacitors 148 such that they are disposed entirely within that perimeter 126. It is important to note that because the MIM capacitor 148 is disposed exclusively within the perimeter 126, that capacitor does not extend over any of the TS layers 130. Therefore, the CA contacts 134 (best seen in FIG. 6) to those TS layers 130 are not blocked by the MIM capacitor 148 and the S/D regions 108 of transistor 106 can be electrically enabled.

The Rx region 138 is defined by the array of fins 104 which extend longitudinally and substantially parallel across the semiconductor structure 100. It is within the Rx region 138 that the source/drain regions 108 and channel regions 110 are embedded. Outside of the Rx region 138 is the isolation region 140 wherein no semiconductor devices are disposed.

During process flow, a pair of capacitor contacts 136 B and 136C are targeted to land on first capacitor plate 125 and second capacitor plate 146, respectively, to provide an electrical connection to the MIM capacitor 148 on both the top layer and bottom layer. The capacitor contacts 136B and 136C can be spaced to induce a predetermined capacitance, and in some embodiments, as well as to provide a predetermined resistance to a current. That is, the contacts 136B and 136B are spaced a specific distance apart such that when a known current is conducted from one contact (136B for example), through the first capacitor plate 125, and into the other contact (136C for example), then the resistivity of the resistor material, as well as the geometry of the first capacitor plate 125, will provide a predetermined resistance to that current. In some embodiments, more than three contacts 136 can be formed, allowing for varied resistivity and varied capacitance across the gate structure 112 depending on which contacts are utilized at one time.

In this embodiment, a portion 142 of the gate structure 112 that is not covered by first capacitor plate 125 is extended over the isolation region 140. Gate (CB) contact 136A lands on that extended portion 142.

Referring to FIG. 7B, a cross sectional view of FIG. 7A taken along the line 7B-7B is presented. The capacitor contacts 136B and 136C extend at least up to the level of oxide fill layer 132.

Figure 7C:
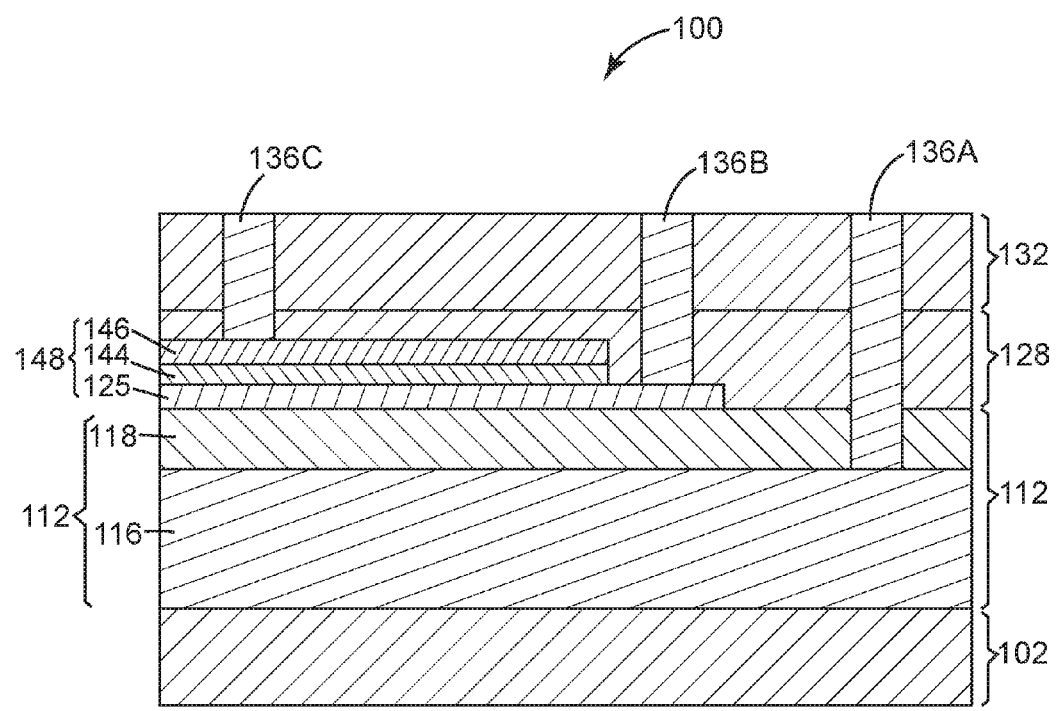
FIG. 7C is a cross sectional view of FIG. 7A taken along the line 7C-7C in accordance with the present invention.

Referring to FIG. 7C, the CB contact 136A penetrates the SAC cap 118 and is electrically connected to the gate metal 116 of the portion 142 of the gate structure 112 not covered by the MIM capacitor 148. Accordingly, the CB contact 136A electrically enables the gate structure 112 to operably control the channel regions 110 of the transistor 106.

It is important to note, that transistor 106 is fully functional even though it is disposed directly under first capacitor plate 125 and, thus, MIM capacitor 148. This is because the MIM capacitor 148 does not extend over the TS layers 130 to block the CB contacts from electrically connecting to the S/D regions 108 and because the gate structure 112 is electrically enabled by CA contact 136A, which is disposed over the isolation region 140. This is in direct contrast to prior art semiconductor structure 10 of FIG. 1, wherein the transistors and other devices located under its resistor 30 are disabled because the resistor blocks the electrical contacts 46 from reaching those devices.

Figure 8A:
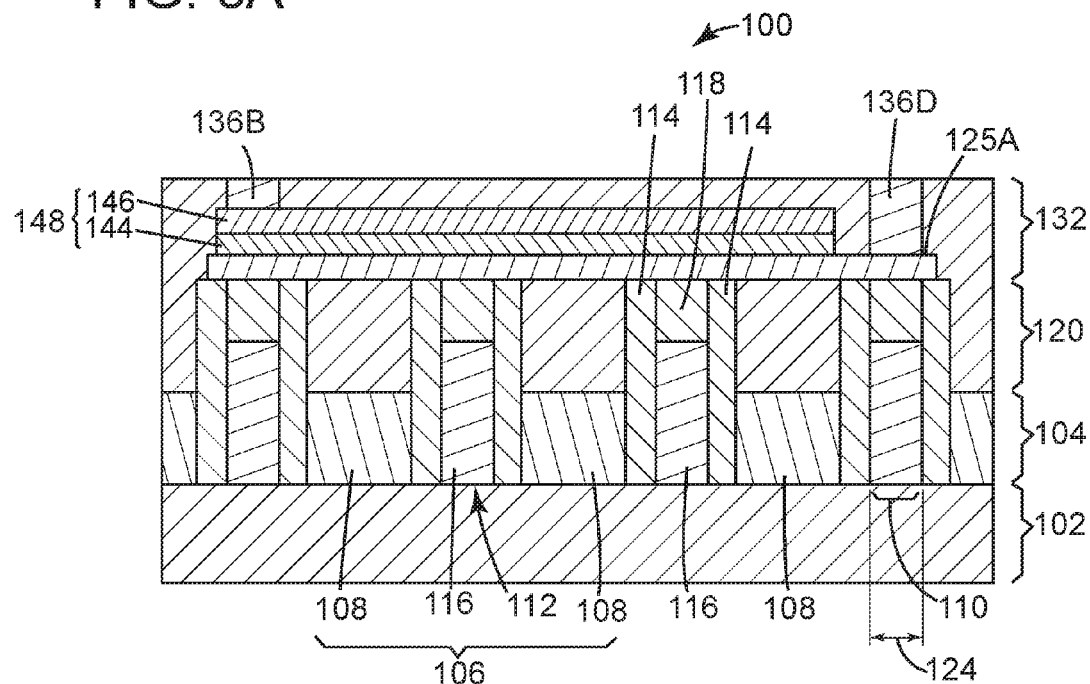
FIG. 8A is an exemplary embodiment of a cross sectional view of a semiconductor structure having gate structures with short channels and a first capacitor plate, insulator layer, and second capacitor plate disposed directly over the SAC caps of the gate structures in accordance with the present invention.

Referring to FIG. 8A, a side view of an exemplary embodiment of semiconductor structure 100 having a short channel 110 is presented. In this case, the channel 110 has a channel height 124 that is 30 nm or less.

In this short channel embodiment, the gate structure 112 is too small to lithographically pattern and etch the first material layer 122 to form first capacitor plates 125 (some of which may be used as resistors) and MIM capacitors 148 that are fully within the perimeter 126 of the top of the gate structure 112. That is, the MIM capacitor 148 must necessarily extend outside of perimeter 126 and over the S/D regions 108 of transistor 106. As such, the MIM capacitor 148 blocks the formation of TS layers 130 and source/drain contacts 134.

Figure 8B:
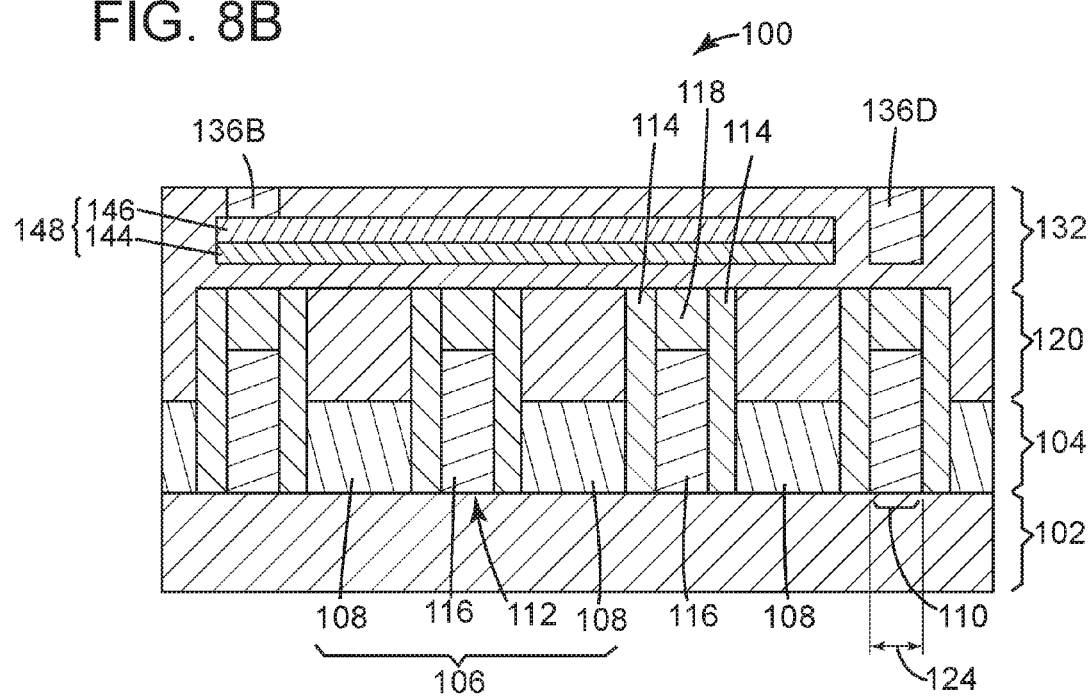
FIG. 8B is an exemplary embodiment of a cross sectional view of a portion of the semiconductor structure of FIG. 8A having gate structures with short channels and only the insulator layer and second capacitor plate disposed directly over the SAC caps of the gate structures in accordance with the present invention.
Figure 8C:
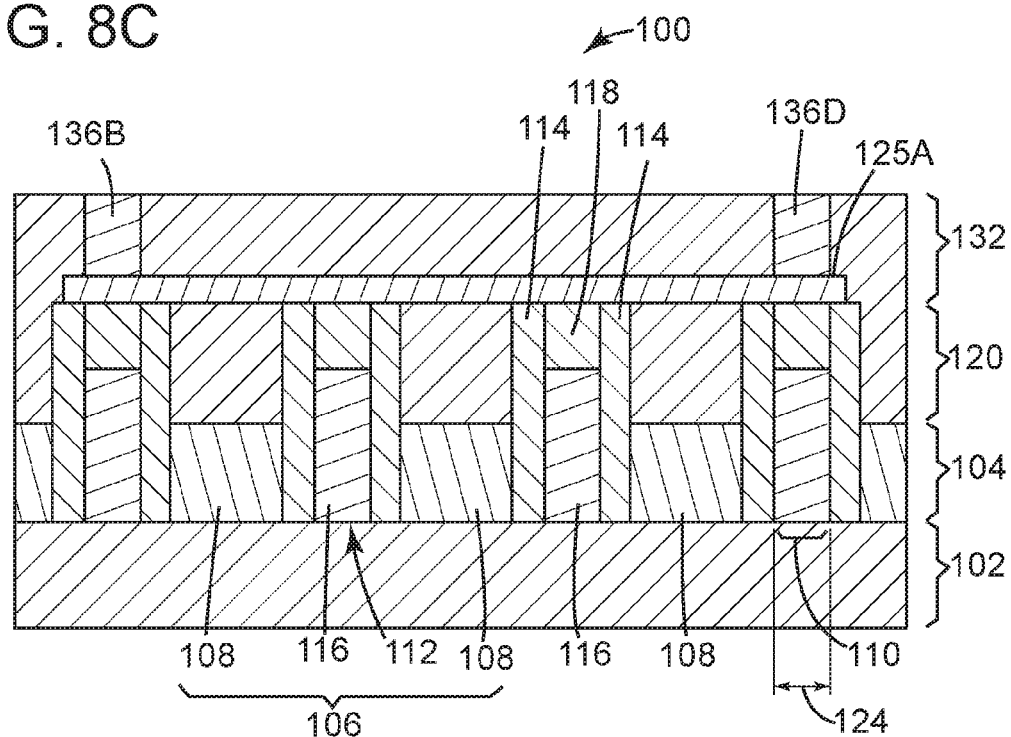
FIG. 8C is an exemplary embodiment of a cross sectional view of a portion of the semiconductor structure of FIG. 8A having gate structures with short channels and only the first capacitor plate disposed directly over the SAC caps of the gate structures in accordance with the present invention.

As depicted in FIGS. 8B and 8C, this can be advantageous. For instance, as seen in FIG. 8B, insulating layer 144 and second capacitor plate 146 may be patterned such that although it forms MIM capacitor 148 in one region, only the insulating layer 144 and the second capacitor plate 148 are over some SAC caps 118, creating a second capacitor plate in these regions. Similarly, some SAC caps 118 have only the first capacitor plate 125, as illustrated in FIG. 8C, directly over them, creating the first resistivity in these areas. Thus, a device can be manufactured that has a portion of the transistor with a MIM capacitor 148 over some areas, a first capacitor plate 125 with one resistivity over some areas, and a second capacitor plate 146 (and insulating layer 144) with a second resistivity over other areas. This allows for a very dynamic device which is highly tunable.

Referring to FIG. 9, a side view of an alternative embodiment of a semiconductor structure 100 is shown. In this embodiment, the resistor 125 is formed directly on the SAC caps 118 with no insulating layer 144 or second capacitor plate 146, and with contacts 136B and 136 D electrically connected to resistor 125. Although the layers are not formed above, the SAC caps 118 can act as an insulating layer, and the gate metal 116 below can act as the second metal, forming a MIM capacitor 148 in conjunction with a resistor 125. The materials of each and thickness of the SAC caps 118 can be designed to function as a MIM capacitor of varied capacitance and the resistor 125 can still be designed to operate at a designed, predetermined resistivity.

It is important to note, that in the short channel embodiments of semiconductor structure 100 illustrated in FIGS. 8A-C and 9, the first capacitor plate 125 of MIM capacitor 148 blocks the formation of electrical contacts between CA contacts 134 and the S/D regions 108. However, it is also important to note that the short channel embodiments of semiconductor structure 100 also eliminate the requirement for a dielectric layer (such as prior art dielectric layer 32 of FIG. 1) disposed between the MIM capacitor 148 and the gate metal 116. This is because, the MIM capacitor 148 is disposed directly upon the SAC cap 118, which serves to electrically isolate the first capacitor plate 125 from the gate metal 116.

In another embodiment, as illustrated in FIG. 10, a method of forming any of the intermediate semiconductor devices 100 described above is disclosed. The method includes, for instance, obtaining an intermediate semiconductor device having a substrate, a plurality of gate structures disposed over the substrate, the gate structures each including: a pair of gate spacers extending generally vertically from the substrate, a gate metal disposed between the spacers, and a self-aligned contact (SAC) cap disposed over the gate metal to form a top of the gate structure 200. Then, a first material is deposited globally over the intermediate semiconductor device 210. In some embodiments, a first mask can be used to etch away some of the first material 220. The first mask can be used to form at least one first capacitor plate of the first material disposed directly upon the SAC cap such that no additional layer is disposed between the first capacitor plate and the SAC cap and at least one resistor of the first material disposed directly upon the SAC cap such that no additional layer is disposed between the resistor and the SAC cap. The difference between the resistor and the first capacitor plate is that the resistor will not have further capacitor layers added to it. In step 230, a second material and a third material are deposited globally over the intermediate semiconductor and the first capacitor plate and resistor. At 240, using a second mask, the second and the third material layers can be etched. These layers can be any of the above disclosed materials used for the insulator layer and the second capacitor plate. That is, the second mask is used to form an insulator disposed over the at least one first capacitor and a second capacitor plate disposed upon the insulator, wherein the first capacitor plate, the insulator, and the second capacitor plate form a metal insulator metal (MIM) capacitor. In some embodiments, all material over the at least one resistor is etched away. At 250, a first capacitor contact electrically connected to the first capacitor plate and a second capacitor contact electrically connected to the second capacitor plate are formed.

As should be further understood from the flow diagram of FIG. 10 and the corresponding description of a method according to some embodiments, a device with a MIM capacitor can be made using one fewer mask than previous embodiments. This increases manufacturing efficiency and reduces the cost of each device made. A single mask can be used to form both resistors and first capacitor plates, and a second mask is used to form both the insulator layer and the second capacitor plate. This previously required at least 3 masks to pattern. Thus, methods according to embodiments allow for combining resistors and capacitors in the middle of line, as well as reducing the masks necessary for fabricating a semiconductor device.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A semiconductor structure comprising:
a substrate;
a gate structure disposed over the substrate, the gate structure including:
a pair of gate spacers extending generally vertically from the substrate;
gate metal disposed between the spacers;
a self-aligned contact (SAC) cap disposed over the gate metal to form a top of the gate structure;
a first capacitor plate disposed directly upon the SAC cap such that no additional layer is disposed between the first capacitor plate and the SAC cap;
an insulator layer disposed upon the first capacitor plate;
a second capacitor plate disposed upon the insulator, wherein the first capacitor plate, the insulator, and the second capacitor plate form a metal insulator metal (MIM) capacitor; and
a first capacitor contact electrically connected to the first capacitor plate and a second capacitor contact electrically connected to the second capacitor plate.

2. The semiconductor structure of claim 1 comprising:
a transistor including:
a pair of source/drain regions disposed within the substrate and defining a channel region therebetween, and
the gate structure, wherein the gate metal is disposed over the channel region.

3. The semiconductor structure of claim 2 comprising the top of the gate structure having a perimeter, wherein the MIM capacitor is disposed entirely within that perimeter.

4. The semiconductor structure of claim 3 comprising the channel having a channel height that is 80 nm or greater.

5. The semiconductor structure of claim 3 comprising:
a portion of the gate structure not covered by the MIM capacitor; and
a gate (CB) contact which penetrates the SAC cap and is electrically connected to the gate metal of the portion of the gate structure not covered by the MIM capacitor;
wherein the CB contact enables the gate structure to operably control the channel region of the transistor.

6. The semiconductor structure of claim 5 wherein the portion of the gate structure not covered by the MIM capacitor extends over an isolation region of the semiconductor structure.

7. The semiconductor structure of claim 2 comprising the top of the gate having a perimeter, wherein the MIM capacitor extends outside of that perimeter and over a source/drain region of the transistor.

8. The semiconductor structure of claim 7 comprising the channel having a channel height that is 30 nm or less.

9. The semiconductor structure of claim 1 wherein the insulator and the second capacitor plate are formed using one mask.

10. The semiconductor structure of claim 9 wherein the first capacitor plate has a first resistivity that is lower than a second resistivity of the second capacitor plate.

11. The semiconductor structure of claim 10 wherein the first capacitor plate comprises tungsten silicide (WSi), titanium nitride (TiN), or tantalum nitride (TaN).

12. The semiconductor structure of claim 11 wherein the second capacitor plate comprises tungsten silicide (WSi).

13. A semiconductor structure comprising:
- a substrate including a plurality of fins extending longitudinally across;
- a plurality of transistors having source/drain regions disposed within the fins and defining channel regions therebetween;
- a plurality of gate structures disposed over the channel regions and extending substantially perpendicular to the fins, the gate structures including:
  - a pair of gate spacers extending generally vertically from the substrate,
  - gate metal disposed between the spacers, and
  - a SAC cap disposed over the gate metal;
- a resistor disposed directly upon at least one SAC cap of at least one transistor such that no additional layer is disposed between the resistor and the at least one SAC cap, wherein the resistor, the SAC cap, and the gate metal form a metal insulator metal (MIM) capacitor.

* * * * *